United States Patent [19]
Radhamohan et al.

[11] Patent Number: 5,997,685
[45] Date of Patent: *Dec. 7, 1999

[54] CORROSION-RESISTANT APPARATUS

[75] Inventors: Charles K. Radhamohan, San Jose; Laxman Murugesh, Fremont; Srihari Ponnekanti, Santa Clara, all of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/632,741

[22] Filed: Apr. 15, 1996

[51] Int. Cl.⁶ .................................................. H05H 1/00
[52] U.S. Cl. ................ 156/345; 118/723 R; 118/723 E; 118/728
[58] Field of Search .............................. 156/345; 118/715, 118/723 R, 723 E, 728; 204/298.01, 298.02, 298.31, 298.06, 298.34; 216/67, 71; 315/111.21

[56] References Cited

U.S. PATENT DOCUMENTS

| | | | |
|---|---|---|---|
| 4,060,120 | 11/1977 | Takahashi et al. | 164/35 |
| 4,061,495 | 12/1977 | Selman et al. | 420/444 |
| 4,306,907 | 12/1981 | Ahn et al. | 75/150 |
| 4,526,644 | 7/1985 | Fujiyama et al. | 216/67 X |
| 5,254,216 | 10/1993 | Frank et al. | 156/345 X |

*Primary Examiner*—Thi Dang
*Attorney, Agent, or Firm*—Janah & Associates

[57] ABSTRACT

A corrosion resistant apparatus for processing a substrate in corrosive process gas comprises (i) a process chamber, (ii) a process gas inlet provided for introducing process gas into the chamber, (iii) a process gas exhaust for exhausting process gas from the chamber, and (iv) processing components for processing the substrate in the chamber. At least a portion of any one of the (i) process chamber, (ii) process gas inlet, (iii) process gas exhaust, or (iv) processing components, is exposed to the corrosive gas in the chamber, and is made of an alloy comprising nickel and eutectic component, the alloy being substantially resistant to corrosion by the corrosive process gas.

46 Claims, 3 Drawing Sheets

CORROSION-RESISTANT APPARATUS

BACKGROUND

This invention relates to a corrosion resistant apparatus for processing substrates, such as semiconductor wafers.

In many types of manufacturing processes, substrates are processed in corrosive process environments. For example, in semiconductor fabrication processes, corrosive process gases are used to deposit material upon, etch, or clean semiconductor wafers. Semiconductor processes are typically carried out in an enclosed process chamber containing metal, ceramic, glass and polymer components. Metal components fabricated from stainless steel, aluminum or high temperature alloys such as "INCONEL," are typically used for holding, loading and positioning substrates in the chamber, for chamber walls, and for controlling process gas flow in and out of the chamber. In addition, ceramic components, such as quartz guards and high temperature chucks, are also used in the chamber. The process chamber and components therein often corrode in corrosive process gas, particularly in reactive halogen gases and plasmas. For example, a plasma of nitrogen trifluoride (which is used to clean process chambers), contains reactive fluorine species that readily corrode aluminum chambers and components.

Corrosion of the components and process chamber by the corrosive process gas limits the lifetime of the apparatus and increases apparatus downtime. The corroded components can also flake off and form contaminant particles which deposit on the substrate. It is difficult to non-destructively detect such contamination during the initial stages of processing the wafer. Thus, it is only in the final stages of the manufacturing process, when a fully processed semiconductor wafer is often worth at least $50,000, that the contaminants are discovered, and the entire wafer is rejected.

Thus, there is a need for a corrosion resistant apparatus and processing components that resist corrosion when exposed to corrosive process gas, and in particular corrosive plasmas. There is also a need for a corrosion resistant apparatus that does not corrode and flake off to form contaminants that deposit on the substrates. There is also a need for a corrosion resistant apparatus that can be easily and inexpensively fabricated.

SUMMARY

The present invention provides a corrosion resistant apparatus that is useful for processing substrates in corrosive process gas. The apparatus comprises a process chamber, a process gas inlet for introducing process gas into the chamber, a process gas exhaust for exhausting process gas from the chamber, and processing components for processing the substrate. At least a portion of any one of the (i) process chamber, (ii) process gas inlet, (iii) process gas exhaust, or (iv) processing components is exposed to the plasma in the chamber and is made of an alloy comprising nickel and eutectic component that is substantially resistant to corrosion by the corrosive process gas. Preferably, the weight percent ratio of nickel to eutectic component is selected so that the alloy comprises a melting temperature of less than about 1550° C., the relatively low melting temperature providing ease of fabrication by conventional casting methods. The present alloy provides increased resistance to corrosion in plasma environments, such as halogen or oxygen plasmas, and is sufficiently corrosion resistant that a corrosion film formed on the alloy after processing in corrosive process gas for at least about 250 hours, is less than about 15 microns thick. The thin corrosion film does not easily flake off and contaminate the substrate.

Preferably, the corrosion-resistant alloy comprises at least about 70 wt % nickel, and more preferably at least about 80 wt % nickel. Preferred eutectic components include beryllium, chromium, and mixtures thereof, which form eutectic systems with nickel that exhibit high corrosion resistance, and low melting points. Preferably, the corrosion resistant alloy comprises beryllium in the amount of from about 1 to about 5 wt %, and chromium in the amount of from about 0.25 to about 20 wt %.

The process chamber itself, or any processing components therein, that are exposed to the corrosive environment can be formed using the corrosion-resistant alloy. These include (i) process chamber walls; (ii) support components for supporting the substrate; (iii) positioning components for positioning the substrate, (iv) gas distributor and inlet components for introducing and distributing process gas in the chamber, (v) gas exhaust components for exhausting gas from the chamber, (vi) plasma generating components for generating a plasma from the process gas, (vii) gas flow containment components for containing the flow of process gas in the chamber, or (viii) fastener components for fastening the components to one another, or to the process chamber walls.

The corrosion-resistant process chamber is used by placing a substrate on a support in the process chamber, introducing a corrosive process gas into the process chamber, and setting process conditions in the process chamber to process the substrate. Typically, a plasma is formed in the process chamber to (i) deposit material on the substrate, such as by chemical vapor deposition processes, (ii) etch material from the substrate, or (iii) clean any one of the substrate, process chamber, process gas inlet, process gas exhaust, or processing components.

DRAWINGS

These and other features, aspects, and advantages of the present invention will become better understood with regard to the following description, appended claims, and accompanying drawings which illustrate examples of the invention, where:

DESCRIPTION

Figure 1:
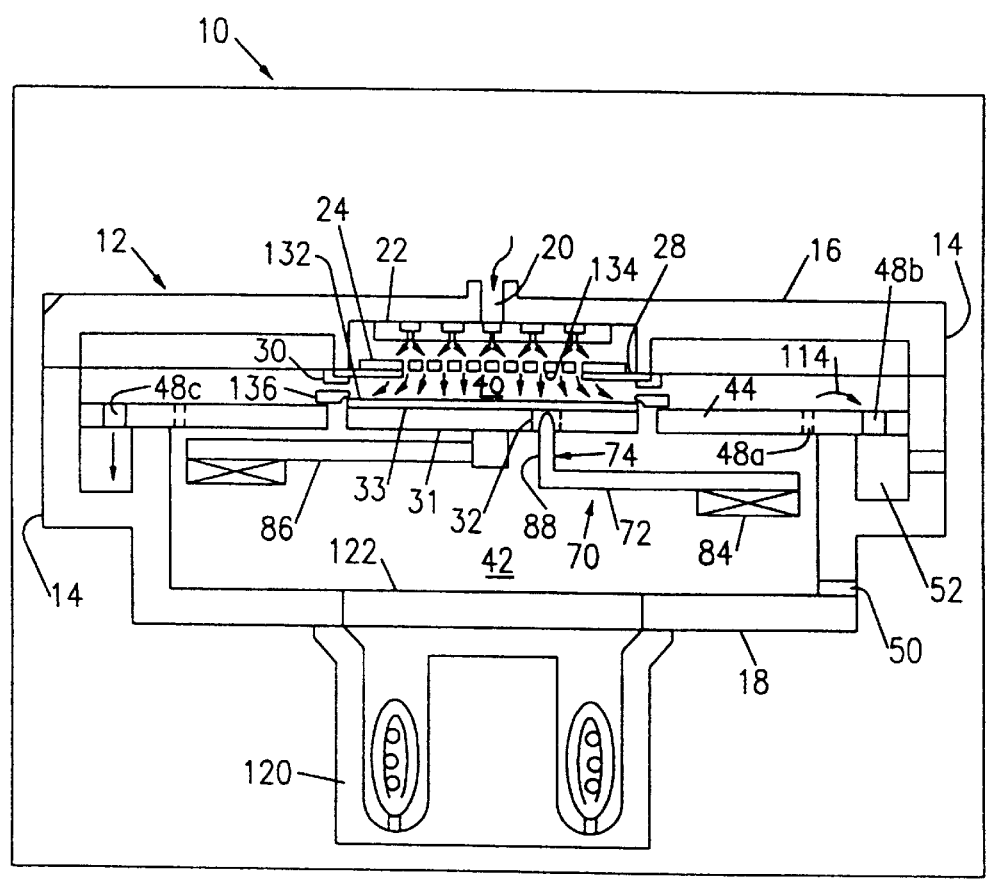
FIG. 1 is a schematic partial cross-section of an apparatus according to the present invention suitable for processing a semiconductor substrate.
Figure 2:
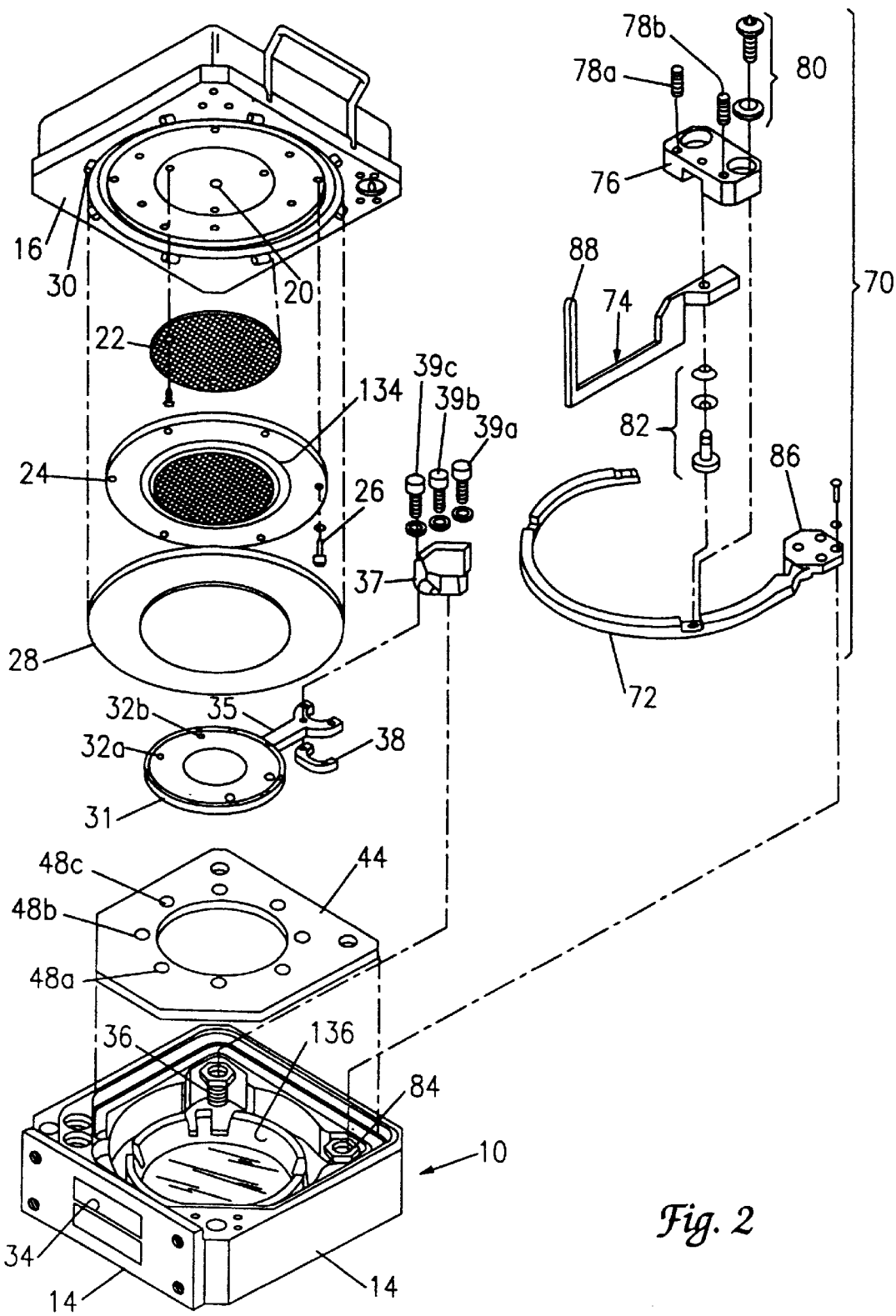
FIG. 2 is an exploded perspective view of the apparatus of FIG. 1, showing processing components within the apparatus.

The present invention provides a corrosion resistant apparatus for processing substrates in corrosive environments, such as a reactive gaseous environments, and particularly for corrosive plasma environments. The corrosion resistance is achieved by fabricating the components of the apparatus exposed to the corrosive environment from an alloy comprising nickel and eutectic component, the alloy being substantially resistant to corrosion by the corrosive process gas. The present invention is illustrated in the context of an exemplary processing apparatus 10 that is schematically shown in FIGS. 1 and 2. The particular embodiment of the processing apparatus 10 shown herein, is suitable for processing planar substrates, such as semiconductor substrates, is provided only to illustrate the invention, and should not be used to limit the scope of the invention. For example, the corrosion-resistant components of the present invention can be used to prevent corrosion of any structure in any corrosive environment, and can be used for manufacturing processes other than semiconductor fabrication.

With reference to FIGS. 1 and 2, the processing apparatus 10 generally comprises an enclosed process chamber 12 having surrounding chamber walls that include sidewalls 14, a top wall 16, and a bottom wall 18. Process gas which can be used to deposit material on a substrate, etch the substrate, or clean the process chamber is introduced into the chamber 12 through a process gas inlet 20. Thereafter, the process gas passes through a process gas distributor comprising a plate having at least one inlet hole for distributing process gas in the process chamber 12 (not shown), and more preferably comprising a perforated blocker plate 22 and "showerhead" diffuser 24 (as shown). The blocker plate 22 and the showerhead 24 are fastened to the chamber top wall 16 by fasteners such as screws 26. A shield ring 28 is detachably clamped over the diffuser 24, and to the top wall 16 by rotable clamps 30.

Within the chamber 12 is located a support 31 having a plurality of holes 32a, 32b therethrough, the support typically comprises a plate of an electrically conductive material sized to receive a substrate thereon. A planar substrate 33, such as a silicon or gallium arsenide wafer, is introduced into the process chamber 12 through a wafer load inlet 34 in the side wall 14 of the chamber 12 to rest upon the support plate 31. The support 31 can be lifted or lowered so that the gap between the substrate 33 and the showerhead 24 can be adjusted for optimal process efficacy. The support 31 has a mounting arm 35 extending thereof. The mounting arm 35 is fastened to a support lift bellows 36 by a bracket 37, a nut plate 38, and screw assemblies 39a, 39b, 39c. The support lift bellows 36 provides a mechanism for lifting and lowering the support 31.

The interior volume of the chamber 12 is divided into a process zone 40 around and above the substrate, and a region 42 below the substrate, with a perforated barrier plate 44 separating the two regions. The perforated barrier plate 44 has exhaust holes 48a, 48b, 48c which are in fluid communication with vacuum manifolds 50 and 52, to withdraw spent process gas and gaseous byproducts from the regions 40 and 42, as shown by the arrow 114 in FIG. 1.

A wafer lift finger assembly 70 is used to lift and lower the substrate 33 onto the support 31. A suitable lift finger assembly 70 comprises a C-shaped ring 72 bearing four lift fingers 74 which extend radially toward the center of the C-shaped ring. The lift fingers 74 are fastened to the C-shaped ring 72 by fasteners comprising lift finger clamps 76 which are screwed over the lift fingers 74 and into the C-shape ring 72, using headless set screws 78a, 78b, a top screw assembly 80 and a bottom screw assembly 82. The C-shaped ring 72 is attached to a finger lift bellows 84 by a mount 86. The lift fingers 74 have prongs 88, which can extend through the holes 32a, 32b of the support plate 31, to contact the substrate 33. The lift bellows 84 lifts and lowers the lift finger assembly 70.

A heater module 120 can be located below the support 31, and underneath a quartz window 122. The heater module 120 can provide radiant energy for heating the substrate 33 for thermally activated processes, such as chemical vapor deposition processes. Alternatively, the support 31 includes a resistor that can be used to resistively heat the substrate 33, instead of using the heater module 120.

A plasma generator is provided to generate a plasma in the process zone 40 of the process chamber 12. The plasma can be generated from process gas (i) inductively by applying an RF current to an inductor coil (not shown) encircling the deposition chamber, (ii) capacitively by applying an RF current to process electrodes in the chamber, (iii) by microwave plasma generators, or (iv) by a mixture of inductive, capacitive, or microwave generation. For example, a capacitive plasma can be generated by applying DC or RF voltage at a power level of from about 100 to about 1000 Watts, and more typically from 100 to 500 Watts, to process electrodes in the process chamber 12 to electrically bias the process electrodes relative to one another, thereby generating an electric field in the process chamber 12. The electrically conductive support 31 and the chamber sidewalls 14 can serve as suitable process electrodes to form the plasma. Alternatively, DC or RF current at a power level of from about 750 Watts to about 2000 Watts can be applied to an inductor coil (not shown) to inductively couple energy into the chamber 12 to generate the plasma in the process zone 40. When an RF current is used, the frequency of the RF current is typically from about 400 Khz to about 16 MHz, and more typically about 13.56 MHz. A gas containment ring or plasma focus ring (not shown) can also be used to contain the flow of process gas, or plasma, around the substrate 33. Suitable plasma containment rings are typically made of dielectric materials, such as aluminum oxide or quartz.

Any of the processing components in the chamber 12 or the process chamber walls that are exposed to the corrosive processing environment can be fabricated from the corrosion resistant alloy, and in particular, the portions of the chamber and components that are exposed to corrosive process gases at temperatures in excess of about 200° C., and in particular in excess of 400° C., are generally subject to severe corrosion. The temperature of the processing component is generally estimated from the temperature of the support 31 that is measured using a thermocouple located in the support 31. The portions of the process chamber 12 and processing components that are not exposed to the corrosive environment in the process chamber 12 can be made from a variety of materials including metals, ceramics, glasses, polymers and composite materials. Suitable metals that are used to fabricate the chamber and processing components, include aluminum, stainless steel, and high temperature alloys such as "INCONEL." Suitable ceramic materials that can be used to fabricate the chamber and components include aluminum oxide, silicon nitride, and boron nitride.

For the exemplary process chamber and processing components used to illustrate the invention, any of the components that are exposed to the corrosive gas, are suitable candidates for fabrication from the corrosion-resistant nickel alloy, some exemplary components being listed in Table I. Although the invention is illustrated with reference to certain components within the chamber 12, it should be understood that any of the components within the chamber 12, including components that are not exposed to the corrosive gases, can be fabricated from the corrosion-resistant alloy. Thus, the present invention should not be limited to the specific examples of components described or illustrated herein.

TABLE I

| CHAMBER OR COMPONENT | REFERENCE NO. |
|---|---|
| Top Wall | 16 |
| Sidewall | 14 |

TABLE I-continued

| CHAMBER OR COMPONENT | REFERENCE NO. |
|---|---|
| Blocker Plate | 22 |
| Showerhead Diffuser | 24 |
| Screws | 26 |
| Rotably Mounted Clamp | 30 |
| Support | 31 |
| Mounting Arm | 35 |
| Support Lift Bellows | 36 |
| Nut Plate | 38 |
| Screw Assembly | 39a, 39b, 39c |
| Barrier Plate | 44 |
| C-ring | 72 |
| Lift arm | 74 |
| Lift Finger Clamp | 76 |
| Headless Screws | 78a, 78b |
| Bottom Screw Assembly | 82 |
| Wafer Lift Bellows | 84 |

The corrosion-resistant alloy is particularly advantageous for use in fabricating the substrate supporting and positioning components within the process chamber, such as the support 31 and lift fingers 72, because these components come in direct contact with the substrate 33. The support 31 holds the substrate 33 during processing, and the lift finger arm 72 is used to raise and lower the substrate 33 off the support 31. Also, because these components directly contact the substrate 33, it is important to minimize corrosion of the components to reduce deposition of corrosion byproducts on the substrate 33. It is a particular advantage of this invention that the reduced contamination provided by the corrosion-resistant alloy increases the yields obtained from the substrate 33. Also, lower levels of diffusion of material from the corrosion-resistant alloy component into the substrate 33 and vice versa, further increases the yields of integrated circuits from the substrate.

Preferred compositions of the corrosion resistant alloy will now be described. The corrosion resistance alloy comprises nickel which is highly resistant to corrosion in corrosive environments. The corrosion resistant alloy preferably comprises at least about 70 wt % nickel, and more preferably at least about 80 wt % nickel. Increasing the nickel concentration increases the corrosion resistance of the alloy; however, excessive nickel concentration can result in excessively high melting temperatures, the melting temperature of nickel being typically about 1550° C. The alloy further comprises an eutectic component that is added to lower the melting point of the nickel alloy to provide increased fluidity at relatively low melting temperatures, and to allow ease of fabrication of components having complex geometries. By eutectic component it is meant an additive, or mixture of additives, that form an eutectic system with nickel that has a melting temperature that is substantially lower than that of pure nickel, preferably less than about 1400° C., and more preferably less than about 1300° C. Preferred eutectic components for the nickel based corrosion alloy, include for example, beryllium, chromium, and mixtures thereof. Typically, the eutectic component forms a binary or ternary alloy with nickel, that has a low eutectic melting temperature, for example, nickel forms ternary eutectic systems with beryllium and chromium. The low melting temperature of the alloy allows precision casting by investment or die cast processes to form complex shaped processing components and process chambers.

In a preferred composition, the corrosion resistant alloy comprises beryllium in an amount ranging from about 1 to about 5 wt %, and more preferably from about 2 to 4 wt %.

The corrosion-resistant alloy can also comprise chromium in addition to beryllium, a suitable chromium content being from about 0.25 to about 20 wt %. In one preferred composition, the corrosion resistant alloy comprises chromium in an amount of from about 0.25 to 1 wt %, and most preferably about 0.5 wt %. In another preferred composition, the corrosion resistant alloy comprises chromium in an amount of from about 8 to about 16 wt %, and most preferably about 12 wt %. The corrosion-resistant alloy can also comprise small amounts, typically less than 2 wt %, of additional elements, such as cobalt, carbon, molybdenum, or mixtures thereof, to provide increased corrosion resistance, thermal shock resistance, or to improve other properties of the alloy. Suitable compositions of corrosion-resistant alloys, as shown in Table II, are commercially available under the trade names BERYLCO™ 41C–46C, from Cabot Corporation, Eading, Pa.

TABLE II

CORROSION-RESISTANT ALLOY COMPOSITIONS

| | 1 | 2 | 3 | 4 | 5 |
|---|---|---|---|---|---|
| Beryllium | 2.75 | 2.75 | 2.75 | 2.00 | 2.00 |
| Chromium | 0.50 | 12.00 | 6.00 | 0.50 | 12.00 |
| Carbon | 0.10 (max) | 0.10 (max) | 0.10 (max) | 0.10 (max) | 0.10 (max) |
| Nickel | Balance | Balance | Balance | Balance | Balance |

It has been discovered that the corrosion resistant alloy comprising nickel, beryllium and/or chromium, provides substantially increased corrosion resistance in corrosive gas environments, particularly for halogen containing plasmas, such as chlorine and fluorine containing plasmas. The corrosion resistant alloy is also resistance to oxidation in oxygen plasmas. It has also been discovered that the corrosion resistant alloy exhibits resistance to corrosion at temperatures in excess of 400° C. This is a particularly useful feature of the present invention and allows use of the apparatus for high temperature CVD and etching processes. Also, the corrosion-resistant nickel alloy is highly thermally conductive, with thermal conductivities of at least about 8.52 Cal$_{IT}$/s/cm/° C. (20.6 BTU/hr/ft$^2$), and more typically at least about 10.5 Cal$_{IT}$/s/cm/° C. (25.5 BTU/hr/ft$^2$), which allows uniform heat transfer across the substrate surface during processing.

The corrosion-resistant alloy is used to form the processing components or process chamber using fabrication processes, such as for example, investment casting, die-casting, stamping, punching, and machining processes. Investment casting is a preferred method of forming the components or process chamber, and generally comprises the steps of (i) forming a mold of the process component or process chamber wall, (ii) heating the corrosion resistant alloy to its melting temperature to form a molten alloy, (iii) pouring the molten alloy into the mold, and (iv) cooling the mold to the solidification temperature of the alloy to form the cast component.

The mold of the chamber wall or processing component is prepared using conventional lost wax processing techniques. Casting wax is used to prepare a model of the processing component, and a truncated cone is fixed on the model to form a channel for pouring molten metal into the mold. A suitable wax is BLUE-INLAY™ made by GC Company, which has a melting temperature of about 55° C. The model and attached cone is placed in a metal ring lined with sand, ceramic casting material, or a high temperature ceramic fiber to form an enclosed volume around the model. Suitable ceramic fibers include alumina or zirconia fibers, for example Zircar™ commercially available from ICI; silica-alumina fibers, such as Affil™ commercially available from ICI; or Kaowool™ fibers, commercially available from Babcock & Wolcox Company. An investment slurry is poured around the model to fill the volume around the model. The investment slurry is typically calcium phosphate, for example, CERAVEST™ commercially available from GC Company; or conventional "plaster of paris," and is prepared by mixing the investment material with water and milling the mixture. After the cast slurry dries, the wax model is melted, and the wax is poured out to form a mold in the shape of the processing component. The resultant mold is heated to a temperature of about 800° C. to 1000° C. to cure and fix the mold.

The corrosion-resistant alloy is melted in a crucible and poured into the investment cast mold environment. The alloy is melted at a temperature of less than about 1400° C., and more preferably from about 1200° C. to 1300° C. The alloy can be melted in air without substantial oxidation or degradation of the alloy. The mold with the molten alloy is then centrifuged in a high frequency centrifuge at high temperatures to form a precision die-cast component, suitable centrifuges being commercially available from Unique Coden Laboratories. The centrifugal process provides superior casting because centrifugal force drives the alloy into the detail of the mold and because the alloy can be injected into the mold immediately after melting with minimum superheating of the alloy. Alternatively, a "static" mold having a vacuum pump connected to the mold to draw out excess air can be used to force the molten alloy into the detail of the mold. The mold is typically maintained at a temperature of about 100° C., to about 500° C. during the casting process to increase the dimensional accuracy of the processing component.

The corrosion resistant apparatus of the present invention is used to process substrates by introducing a process gas into the chamber, and setting process conditions suitable for processing the substrate. The process conditions within the chamber can be set to deposit material on the substrate, such as by chemical vapor deposition, etch material from the substrate, or remove contaminant deposits from on the substrate, chamber walls and processing components. Typical chemical vapor deposition (CVD) processes for depositing dielectric and polysilicon films on a substrate, use (i) process gases such silicon source gas for example $SiH_4$ or $SiCl_2H_2$, and an oxygen source gas such as $CO_2$ and $H_2$, or $N_2O$; or (ii) a single gas containing both silicon and oxygen such as $Si(OC_2H_5)_4$. CVD processes for depositing $Si_3N_4$ typically use gases such as $SiH_4$ and $NH_3$ or $N_2$. Other conventional CVD process gases include $NH_3$, $AsH_3$, $B_2H_6$, HCl, $PH_3$ and $SiH_4$. CVD processes can be also used to deposit refractory metals such as molybdenum silicide, tantalum silicide, and tungsten silicide, as generally described in *VLSI Technoloqy, Second Edition*, Chapter 9, by S. M. Sze, McGraw-Hill Publishing Company (1988), which is incorporated herein by reference. The apparatus can also be used to etch material from the substrate. Conventional metal interconnect etching processes use halogen containing gases such as $BCl_3$, $Cl_2$, $SF_6$, $CF_4$, $C_4F_4$, $CFCl_3$, $CF_2Cl_2$, $CF_3Cl$, $CHF_3$, $CH_3F$, and $C_2ClF_5$, HF, $SiCl_4$, $NF_3$, $F_2$, and $CCl_4$. Resist etching processes typically use oxygen gas to etch the polymeric resist on the substrate.

The apparatus is particularly suited to process substrates in highly corrosive plasmas that are used to deposit material, etch, or clean substrates. A typical plasma etching processes uses a plasma of chlorine, oxygen, or $SiCl_4$, to etch the conductive layer, as generally described in *VLSI Technology, Second Edition*, Chapter 5, by S. M. Sze, McGraw-Hill Publishing Company (1988), which is incorporated herein by reference. Another example is the use of plasma in reactive ion-etching processes to etch through metallic layers on substrates, as for example, described in U.S. Pat. No. 4,190,488, to Winters, which is incorporated herein by this reference. Plasma processes that use $NF_3$ to clean substrates are generally described in U.S. Pat. No. 5,201,990, to Chang, et al., which is also incorporated herein by reference. Plasmas are also used for depositing coatings on the substrate, as in plasma-enhanced chemical vapor deposition (CVD) processes, as generally described in U.S. Pat. No. 5,093,150, to Somero, et al., and U.S. Pat. No. 4,969,415, to Bartha, et al., both of which are incorporated herein by reference.

EXAMPLE 1

The following example illustrates the corrosion performance of conventional aluminum components as compared to the corrosion-resistant alloy of the present invention, in a corrosive gaseous plasma environment. Small rectangular specimens of (i) aluminum and (ii) corrosion-resistant alloy were placed on a silicon wafer in a process chamber. Three of the corrosion-resistant alloy specimens had a composition of 97.5 wt % nickel, 2 wt % beryllium, 0.5 wt % chromium, and trace amounts of carbon. Another three specimens of the corrosion-resistant alloy comprised 85.3 wt % nickel, 2.7 wt % beryllium, 12 wt % chromium, and trace amounts of carbon.

A reactive "cleaning" gas such as nitrogen trifluoride ($NF_3$) was introduced into the chamber, and a plasma was generated by positively applying an RF current at a power level of 10 to 1000 Watts to the top wall 16, the blocker plate 22, and the showerhead 24 by applying a simultaneously grounding the barrier plate 44 and chamber walls 14. The chamber 12 was maintained at a temperature of about 400° C. The RF plasma cleans the residual CVD deposits in the chamber by reacting with the deposits on the substrate 33, chamber walls 14, and components, to form gaseous compounds which are exhausted from the chamber.

The specimens were exposed to the fluorine containing plasma for a total of about 250 hours of exposure. After every 24 hours of exposure, an aluminum specimen and one of each of the corrosion-resistant alloy specimens were taken out, and a microscope was used to photograph the specimens to determine the extent of surface corrosion. Little or no corrosion byproducts, such as flaking particles, were visually detected using the microscope.

At the end of the 250-hour exposure, the specimens were sectioned using a diamond saw and examined by a scanning electron microscope. It was found that the thickness of the corrosion film on both types of corrosion-resistant alloy specimens, after the 250 hour exposure, was less than 15 $\mu$m, and in most places was less than about 10 $\mu$m. This is much less than conventional aluminum specimens, which after 250 hours of exposure to a halogen plasma, typically exhibit a corrosion film having a thickness of about 25 microns.

Figure 3:
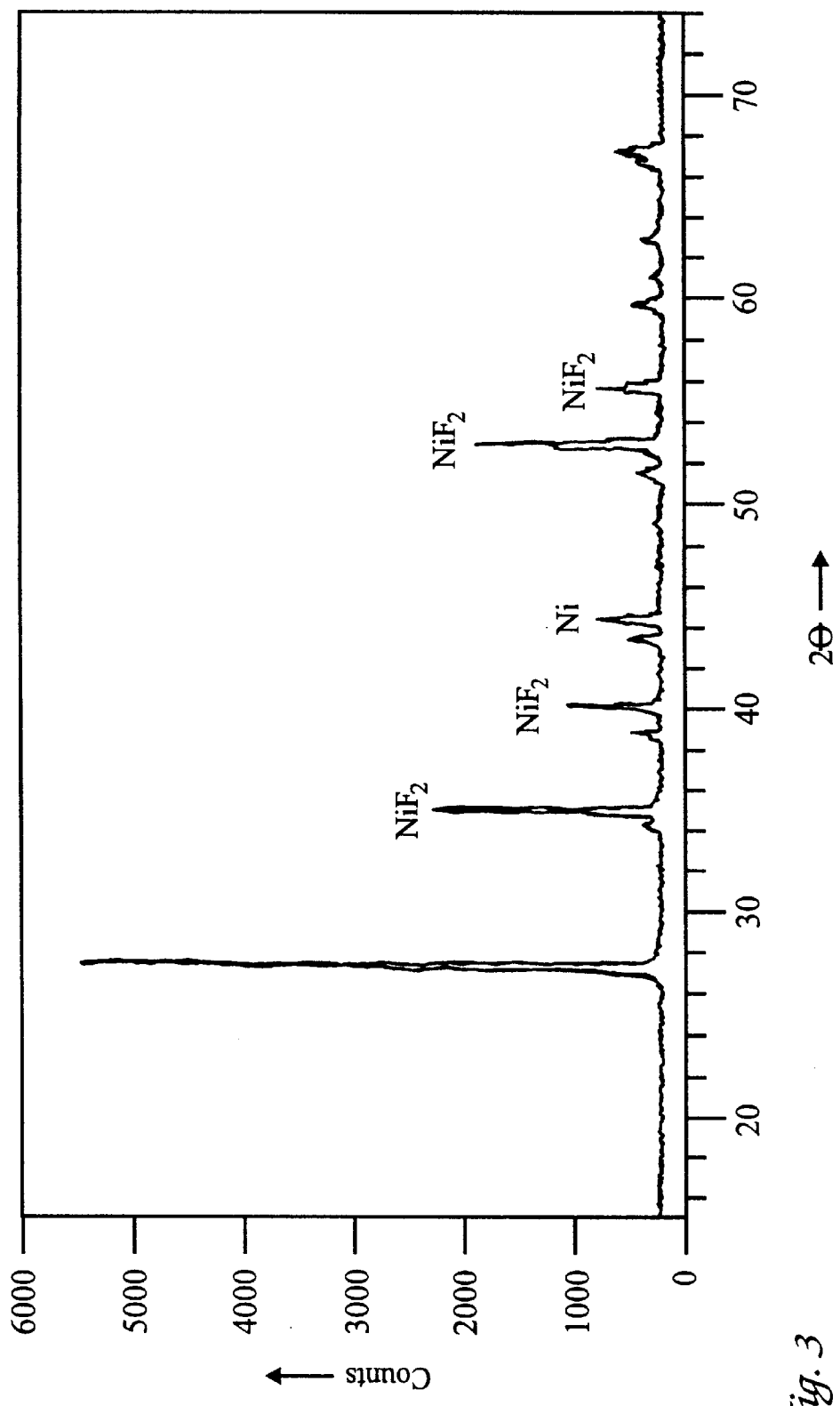
FIG. 3 is a graph of an x-ray diffraction pattern of a component made from the corrosion-resistant alloy after exposure of the component to a fluorine-containing plasma.

FIG. 3 shows an x-ray diffraction pattern of the surface of a corrosion-resistant alloy specimen after exposure to the plasma for about 250 hours. The intensity of the diffracted x-ray beam measured by the number of counts is shown on the y axis, and the x-axis provides the angle of rotation of the x-ray diffractometer. The positions of the x-ray diffraction peaks for nickel fluoride and nickel are in the graph. It is seen that the corrosion of the nickel-beryllium alloy in the NF$_3$ environment results primarily in the formation of a thin corrosion film of NiF$_2$, which does not adversely affect processing of the substrates 33.

The present invention has been described in considerable detail with reference to certain preferred versions thereof; however, other versions are possible. For example, the present invention can be used to provide corrosion resistance for other types of structures and apparatuses and is not limited to processing of semiconductor wafers. Therefore the spirit and scope of the appended claims should not be limited to the description of the preferred versions contained herein.

What is claimed is:

1. An apparatus for processing a substrate in process gas, the apparatus comprising:
   (a) a process chamber;
   (b) a process gas inlet;
   (c) a process gas exhaust; and
   (d) processing components,
   wherein at least a portion of any one of the process chamber, process gas inlet, process gas exhaust, or processing components, is exposed to process gas that is introduced through the process gas inlet to process the substrate and exhausted through the process gas exhaust, and is a cast shape made of a corrosion-resistant alloy comprising nickel and eutectic component in a weight percent ratio that provides resistance to corrosion by the process gas, and a sufficiently low melting temperature to fabricate the cast shape of the process chamber, process gas inlet, process gas exhaust, or processing components.

2. The apparatus of claim 1, wherein the weight percent ratio of nickel to eutectic component is selected so that the melting temperature of the corrosion-resistant alloy is less than about 1550° C.

3. The apparatus of claim 1, wherein the weight percent ratio of nickel to eutectic component is selected so that the corrosion-resistant alloy is sufficiently corrosion resistant that a thickness of a corrosion film formed on the corrosion-resistant alloy after processing in the process gas for at least about 250 hours, is less than about 15 microns.

4. The apparatus of claim 1, wherein the weight percent ratio of nickel to eutectic component is selected so that the corrosion-resistant alloy undergoes substantially no diffusion into the substrate at processing temperatures of up to about 400° C.

5. The apparatus of claim 1, wherein the corrosion-resistant alloy comprises at least about 70 wt % nickel.

6. The apparatus of claim 5, wherein the corrosion-resistant alloy comprises at least about 80 wt % nickel.

7. The apparatus of claim 1, wherein the eutectic component comprises at least one element selected from the group consisting of beryllium or chromium.

8. The apparatus of claim 7, wherein the corrosion-resistant alloy comprises at least about 1 wt % beryllium.

9. The apparatus of claim 7, wherein the corrosion-resistant alloy comprises at least about 0.25 wt % chromium.

10. The apparatus of claim 1, wherein the corrosion-resistant alloy further comprises an element selected from the group consisting of cobalt, carbon, molybdenum, and mixtures thereof.

11. The apparatus of claim 1, wherein the processing components comprise at least one of the following:
   (a) a gas distributor component for distributing the process gas in the process chamber;
   (b) plasma generating components comprising an inductor coil, electrode, or microwave generator;
   (c) gas flow containment components having a wall for containing the flow of process gas around the substrate in the process chamber;
   (d) a support having a surface for supporting the substrate in the process chamber; or
   (e) substrate positioning components.

12. The apparatus of claim 11, wherein the positioning components comprise at least one of the following:
   (a) a mounting arm;
   (b) a lift bellow; or
   (c) a lift finger assembly.

13. The apparatus of claim 1, wherein the process gas inlet is adapted to introduce into the chamber a process gas comprising halogen containing gas.

14. A method of using the apparatus of claim 1 to process a substrate in corrosive process gas, the method comprising the steps of:
   (a) placing a substrate on a support in the process chamber;
   (b) introducing a corrosive process gas into the process chamber; and
   (c) setting process conditions in the process chamber to process the substrate.

15. The method of claim 14, wherein step (c) comprises the step of generating a plasma from the corrosive process gas, and wherein the corrosion-resistant alloy is resistant to corrosion by the plasma.

16. The method of claim 14, wherein step (c) comprises the step of maintaining process conditions in the process chamber so that the corrosive process gas is capable of at least one of the following:
   (a) depositing material on the substrate by chemical vapor deposition;
   (b) etching material from the substrate; or
   (c) cleaning at least one of the group consisting of the substrate, process chamber, process gas inlet, process gas exhaust, or processing components.

17. An apparatus for processing a substrate in a plasma, the apparatus comprising:
   (a) a process chamber; and
   (b) means for processing the substrate in the process chamber, wherein at least a portion of any one of the process chamber or means for processing the substrate in the process chamber is exposed to the plasma in the process chamber and is a cast shape made of an alloy consisting essentially of nickel and eutectic component in a weight percent ratio that provides resistance to corrosion by the plasma, and a low melting temperature.

18. The apparatus of claim 17, wherein the weight percent ratio of nickel to eutectic component is selected so that the corrosion-resistant corrosion-resistant alloy comprises a melting temperature of less than about 1550° C.

19. The apparatus of claim 17, wherein the corrosion-resistant corrosion-resistant alloy comprises at least about 70 wt % nickel.

20. The apparatus of claim 17, wherein the eutectic component comprises at least one element selected from the group consisting of beryllium or chromium.

21. The apparatus of claim 20, wherein the corrosion-resistant corrosion-resistant alloy comprises at least about 1 wt % beryllium.

22. The apparatus of claim 20, wherein the corrosion-resistant corrosion-resistant alloy comprises at least about 0.25 wt % chromium.

23. An apparatus for processing a substrate in process gas, the apparatus comprising:
(a) a process chamber;
(b) a process gas inlet having an inlet for introducing process gas into the process chamber;
(c) a process gas exhaust having an exhaust hole for exhausting process gas from the process chamber; and
(d) substrate processing components,
wherein at least a portion of any one of the process chamber, process gas inlet, process gas exhaust, or processing components, is exposed to the process gas in the chamber, and is a cast shape made of a corrosion-resistant alloy comprising at least about 70 weight percent nickel, and less than about 30 weight percent of eutectic component selected from the group consisting of beryllium and chromium, the weight percent ratio of nickel to eutectic component selected to provide a sufficiently low melting temperature to fabricate the cast shape of the process chamber, process gas inlet, process gas exhaust, or processing components.

24. The apparatus of claim 23, wherein the weight percent ratio of nickel to eutectic component is selected so that the melting temperature of the corrosion-resistant alloy is less than about 1550° C.

25. The apparatus of claim 23, wherein the weight percent ratio of nickel to eutectic component is selected so that the corrosion-resistant alloy is sufficiently corrosion resistant that a thickness of a corrosion film formed on the corrosion-resistant alloy after processing in process gas for at least about 250 hours is less than about 15 microns.

26. The apparatus of claim 23, wherein the corrosion-resistant alloy comprises at least about 70 wt % nickel.

27. The apparatus of claim 26, wherein the corrosion-resistant alloy comprises at least about 80 wt % nickel.

28. The apparatus of claim 23, wherein the eutectic component comprises at least one element selected from the group consisting of beryllium or chromium.

29. The apparatus of claim 23, wherein the corrosion-resistant alloy comprises at least about 1 wt % beryllium.

30. The apparatus of claim 23, wherein the corrosion-resistant alloy comprises at least about 0.25 wt % chromium.

31. The apparatus of claim 23, wherein the corrosion-resistant alloy further comprises an element selected from the group consisting of cobalt, carbon, molybdenum, and mixtures thereof.

32. A component for processing a substrate in process gas, the component comprising any one of the following:
(a) a gas distributor component having an inlet for distributing the process gas in a process zone;
(b) a support component having a surface for supporting the substrate in the process zone;
(c) a substrate positioning component;
(d) a plasma generating component comprising an inductor coil, electrode, or microwave generator;
(e) a process gas flow containment component; or
(f) a process gas exhaust component,
wherein at least a portion of a component is exposed to the process gas, and is a cast shape made of a corrosion-resistant alloy comprising nickel and eutectic component in a weight percent ratio that provides resistance to corrosion by the process gas, and a sufficiently low melting temperature to cast the component.

33. The component of claim 24, wherein the weight percent ratio of nickel to eutectic component is selected so that the melting temperature of the corrosion-resistant alloy is less than about 1550° C.

34. The component of claim 24, wherein the weight percent ratio of nickel to eutectic component is selected so that the corrosion-resistant alloy is sufficiently corrosion resistant that a thickness of a corrosion film formed on the corrosion-resistant alloy after processing in the process gas for at least about 250 hours is less than about 15 microns.

35. The component of claim 32, wherein the weight percent ratio of nickel to eutectic component is selected so that the corrosion-resistant alloy undergoes substantially no diffusion into the substrate at processing temperatures of up to about 400° C.

36. The component of claim 32, wherein the corrosion-resistant alloy comprises at least about 70 wt % nickel.

37. The component of claim 36, wherein the corrosion-resistant alloy comprises at least about 80 wt % nickel.

38. The component of claim 32, wherein the eutectic component comprises at least one element selected from the group consisting of beryllium or chromium.

39. The component of claim 38, wherein the corrosion-resistant alloy comprises at least about 1 wt % beryllium.

40. The component of claim 38, wherein the corrosion-resistant alloy comprises at least about 0.25 wt % chromium.

41. The component of claim 32, wherein the corrosion-resistant alloy further comprises an element selected from the group consisting of cobalt, carbon, molybdenum, and mixtures thereof.

42. The component of claim 24, wherein the gas distributor component comprises a plate having at least one hole.

43. The component of claim 32, wherein the plasma generating component comprises process electrodes in a process chamber, the process electrodes capable of being electrically biased relative to one another to generate an electric field in the process chamber.

44. The component of claim 24, wherein the substrate positioning component comprises at least one of the following:
(a) a mounting arm;
(b) a lift bellow; or
(c) a lift finger assembly.

45. The component of claim 32, wherein the support component comprises an electrically conductive plate sized to receive a substrate thereon.

46. The component of claim 24, wherein the process gas flow containment component comprises a plasma focus ring.

* * * * *